United States Patent
Miyajima et al.

(10) Patent No.: US 8,669,592 B2
(45) Date of Patent: Mar. 11, 2014

(54) COMPOUND SEMICONDUCTOR DEVICE AND METHOD FOR FABRICATING THE SAME

(75) Inventors: Toyoo Miyajima, Isehara (JP); Kenji Imanishi, Atsugi (JP); Atsushi Yamada, Isehara (JP); Norikazu Nakamura, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/551,775

(22) Filed: Jul. 18, 2012

(65) Prior Publication Data

US 2013/0082360 A1 Apr. 4, 2013

(30) Foreign Application Priority Data

Sep. 29, 2011 (JP) ................. 2011-214724

(51) Int. Cl.
*H01L 29/66* (2006.01)
(52) U.S. Cl.
USPC ......................................... 257/194
(58) Field of Classification Search
USPC .......................................... 257/194
See application file for complete search history.

(56) References Cited

U.S. PATENT DOCUMENTS

2011/0127540 A1* 6/2011 Yamada et al. ............. 257/76
2011/0227093 A1 9/2011 Hikita

FOREIGN PATENT DOCUMENTS

JP 2010-135641 6/2010

OTHER PUBLICATIONS

M. Hikita, et al.; GaN-Based Power Devices; Panasonic Technical Journal; vol. 55; No. 2; Jul. 2009; pp. 21-25 (5 Sheets).
Y. Uemoto, et al.; Gate Injection Transistor (GIT)—A Normally-Off AlGaN/GaN Power Transistor Using Conductivity Modulation; IEEE Transactions on Electron Devices; vol. 54; No, 12; Dec. 2007; pp. 3393-3399 (7 Sheets)/p. 2 of specification/Corresponds to M. Hikita, et al.; GaN-Based Power Devices; Panasonic Technical Journal; vol. 55; No. 2; Jul. 2009; pp. 21-25 (5 Sheets).
Korean Office Action issued for Korean Patent Application Serial No. 10-2012-83025 dated Aug. 21, 2013.

* cited by examiner

*Primary Examiner* — David Vu
*Assistant Examiner* — Brandon Fox
(74) *Attorney, Agent, or Firm* — Kratz, Quintos & Hanson, LLP (57) ABSTRACT

A compound semiconductor multilayer structure is formed on a Si substrate. The compound semiconductor multilayer structure includes an electrode transit layer, an electrode donor layer formed above the electron transit layer, and a cap layer formed above the electron donor layer. The cap layer contains a first crystal polarized in the same direction as the electron transit layer and the electron donor layer and a second crystal polarized in the direction opposite to the polarization direction of the electron transit layer and the electron donor layer.

12 Claims, 8 Drawing Sheets

COMPOUND SEMICONDUCTOR DEVICE AND METHOD FOR FABRICATING THE SAME

CROSS-REFERENCE TO RELATED APPLICATION

This application is based upon and claims the benefit of priority of the prior Japanese Patent Application No. 2011-214724, filed on Sep. 29, 2011, the entire contents of which are incorporated herein by reference.

FIELD

The present embodiments relate to a compound semiconductor device including a compound semiconductor layer and a method for fabricating the compound semiconductor device.

BACKGROUND

Nitride semiconductor devices are being actively developed as high-withstand-voltage high-power semiconductor devices which take advantage of characteristics such as high saturated electron velocities and wide bandgaps. Among nitride-semiconductor devices, many reports on nitride-semiconductor field-effect transistors, especially High Electron Mobility Transistors (HEMTs), have been made. In particular, attention is being focused on AlGaN/GaN HEMTs that have an electron transit layer of GaN and an electron donor layer of AlGaN. In an AlGaN/GaN HEMT, distortion due to the difference in lattice constant between GaN and AlGaN occurs in AlGaN. This causes piezoelectric polarization and spontaneous polarization of AlGaN to provide a high-concentration two-dimensional electron gas (2DEG). Accordingly, high withstand voltage and high power can be achieved.

Non-Patent Document 1: Panasonic Technical Journal Vol. 55, No. 2, 2009

In switching elements used in devices such as power supply devices, the so-called normally-off operation in which no current flows in the absence of voltage is desired in terms of fail-safe. However, in a GaN HEMT that uses high-concentration 2DEG, current flows even in the absence of gate voltage because there are many electrons in the channel of the transistor. To shut off the current, a negative voltage needs to be applied to the gate electrode, and thus the device operates in a normally-on mode.

One proposed approach to implementing a normally-off GaN HEMT is to form a p-type GaN layer or a p-type AlGaN layer on an electron donor layer to control the concentration of 2DEG by a band modulation effect.

The p-type (Al)GaN layer is doped with an acceptor impurity, typically Mg. Since Mg has an activation rate as low as approximately 1%, it is difficult to make a p-type GaN crystal that has a high hole concentration. Therefore, in the case of the p-type (Al)GaN layer formed on the electron donor layer, the p-type (Al)GaN layer needs to be thicken in order to increase the energy level of the conduction band at the AlGaN/GaN hetero interface to a level higher than the Fermi level.

However, thickening the p-type GaN layer increases the distance from the gate electrode to the AlGaN/GaN hetero interface which serves as a channel. Accordingly, response speed decreases and electric fields in the channel from the gate electrode will be insufficient, thereby causing degradations of device characteristics, such as poor pinch-off.

SUMMARY

One mode of a compound semiconductor device includes an electrode transit layer, an electron donor layer formed above the electron transit layer, and a cap layer formed above the electron donor layer. The cap layer contains a first crystal polarized in the same direction as the electron transit layer and the electron donor layer and a second crystal polarized in the direction opposite to the polarization direction of the electron transit layer and the electron donor layer.

One mode of a method for fabricating a compound semiconductor device involves forming an electrode transit layer, forming an electron donor layer above the electron transit layer, forming a cap layer above the electron donor layer. The cap layer contains a first crystal polarized in the same direction as the electron transit layer and the electron donor layer and a second crystal polarized in the direction opposite to the polarization direction of the electron transit layer and the electron donor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Specific embodiments of compound semiconductor devices will be described below in detail with reference to drawings. It is noted that thicknesses and dimensions of some of the components in some of the drawings are not to scale for ready understanding.

(First Embodiment)

In a first embodiment, an AlGaN/GaN HEMT of Schottky type will be disclosed as a compound semiconductor device.

FIGS. 1 and 2 are schematic cross-sectional views illustrating step by step a method for fabricating an AlGaN/GaN HEMT of Schottky type according to the first embodiment.

Figure 1A:
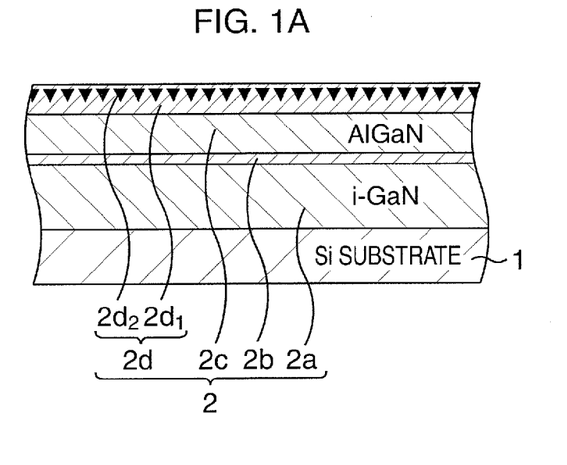
FIG. 1 is a schematic cross-sectional view illustrating step by step a method for fabricating an AlGaN/GaN HEMT of Schottky type according to a first embodiment.

In the first embodiment, a compound semiconductor multilayer structure 2 is formed on a growth substrate, for example a Si substrate 1, as illustrated in FIG. 1A. The growth substrate may be a semi-insulating SiC substrate, a sapphire substrate, a GaAs substrate, or a GaN substrate instead of the Si substrate. The substrate may be a semi-insulating or conductive substrate.

The compound semiconductor multilayer structure 2 includes an electron transit layer 2a, an intermediate layer (spacer layer) 2b, an electron donor layer 2c, and a cap layer 2d.

Specifically, compound semiconductors given below are grown on the Si substrate 1 by Metal Organic Vapor Phase Epitaxy (MOVPE), for example. Other method such as Molecular Beam Epitaxy (MBE) may be used instead of MOVPE.

Compound semiconductors that serve as the electron transit layer 2a, the intermediate layer 2b, the electron donor layer 2c and the cap layer 2d are formed on the Si substrate 1 in that order. The electron transit layer 2a is formed by growing i (intentionally-undoped)-GaN to a thickness in the range of approximately 1 µm to approximately 3 µm on the Si substrate 1. The intermediate layer 2b is formed by growing i-AlGaN to a thickness of approximately 5 nm. The electron donor layer 2c is formed by growing n-AlGaN to a thickness of approximately 30 nm.

The cap layer 2d is formed by growing p-GaN to a relatively small thickness, for example to a thickness in the range of approximately 50 nm to approximately 100 nm. If the cap layer 2d is thinner than 50 nm, a desired normally-off operation cannot be achieved; if the cap layer 2d is thicker than 100 nm, the distance from a gate electrode to the AlGaN/GaN hetero interface, which serves as a channel, will be long, so that response speed will decrease and electric fields in the channel from the gate electrode will be insufficient, thereby causing defects such as poor pinch-off. Therefore, the cap layer 2d is formed to a thickness in the range of approximately 50 nm to approximately 100 nm to ensure high response speed and prevents degradations of the device characteristics, such as poor pinch-off, while achieving a proper normally-off operation. In this embodiment, p-GaN of the cap layer 2d is formed to a thickness of approximately 50 nm. The cap layer 2d may be formed of p-AlGaN instead of p-GaN.

To grow GaN, mixed gas of trimethyl gallium (TMGa) gas, which is the Ga source, and ammonium ($NH_3$) gas is used as the material gas. To grow AlGaN, mixed gas of TMAl gas, TMGa gas and $NH_3$ gas is used as the material gas. Supplying and discontinuing supplying the TMAl and TMGa gases and the flow rates of the TMAl and TMGa gases are set as appropriate according to the compound semiconductor layer to grow. The flow rate of the $NH_3$ gas, which is a material common to the layers, is set to a value in the range of approximately 100 sccm to approximately 10 slm. The growth pressure is set to a value in the range of approximately 50 Torr to 300 Torr and the growth temperature is set to a value in the range of approximately 1000° C. to 1200° C.

When AlGaN is grown as the n-type, that is, when the electron donor layer 2c (n-AlGaN) is formed, an n-type impurity is added to the material gas of AlGaN. Here, for example silane ($SiH_4$) gas containing Si for example is added at a given flow rate to the material gas to dope AlGaN with Si. The doping concentration of Si is set to a value in the range of approximately $1\times10^{18}/cm^3$ to approximately $1\times10^{20}/cm^3$, for example approximately $2\times10^{18}/cm^3$.

When GaN is grown as the p-type, that is, when the cap layer 2d is formed, a p-type impurity, for example Mg, is added to the material gas of GaN. In this embodiment, Mg is used as the p-type impurity. Mg is added at a predetermined flow rate to the material gas to dope GaN with Mg. The doping concentration of Mg is in the range of approximately $5\times10^{19}/cm^3$ to approximately $1\times10^{20}/cm^3$, for example. If the doping concentration is less than approximately $5\times10^{19}/cm^3$, p-type GaN without polarity-inverted crystals will result. If the doping concentration is higher than approximately $1\times10^{20}/cm^3$, segregation of Mg or degradation of crystallinity of GaN will result. By choosing a Mg doping concentration in the range of approximately $5\times10^{19}/cm^3$ to approximately $1\times10^{20}/cm^3$, good-quality p-type GaN crystals that include polarity-inverted crystals in GaN crystals can be produced.

It is noted that if the cap layer is formed by growing AlGaN of p-type, Mg may be added to the material gas of AlGaN with a doping concentration in the range given above as well.

In this embodiment, as a result of growing p-GaN as described above, the cap layer 2d containing a first GaN crystal and a second GaN crystal is formed. The first GaN crystal is a GaN crystal polarized in the same direction as the electron transit layer 2a and the electron donor layer 2c. The second GaN crystal is a GaN crystal polarized in the direction opposite to the polarization direction of the electron transit layer 2a and the electron donor layer 2c (polarity-inverted crystal). The electron transit layer 2a and the electron donor layer 2c have a crystal growth plane (0001). On the other hand, the cap layer 2d contains the first crystal $2d_1$ (which becomes Ga-face) which has a crystal growth plane (0001) and the second crystal $2d_2$ (which becomes N-face) which has a crystal growth plane (000-1). In this embodiment, the second crystal $2d_2$ is formed at the top portion of the cap layer 2d. The second crystal $2d_2$ is formed in the shape of an inverted triangle, for example.

Figure 1B:
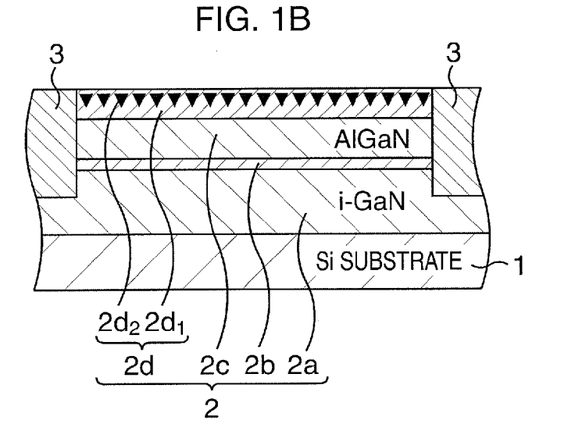

Then, an element isolating structure 3 is formed as illustrated in FIG. 1B. The element isolating structure 3 is omitted from FIG. 1C and the subsequent drawings.

Specifically, argon (Ar), for example, is injected into the element isolating region of the compound semiconductor multilayer structure 2. As a result, the element isolating structure 3 is formed in the compound semiconductor multilayer structure 2 and a surface portion of the Si substrate 1. An active region is defined on the compound semiconductor multilayer structure 2 by the element isolating structure 3.

It is noted that element isolation may be made by other known method such as Shallow Trench Isolation (STI), for example, instead of the injection method described above. Here, chlorine-based etching gas, for example, is used for dry etching of the compound semiconductor multilayer structure 2.

Figure 1C:
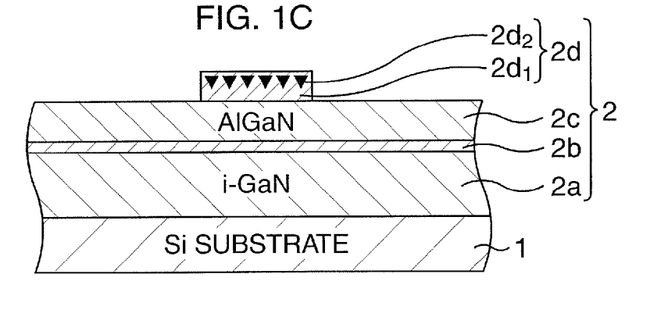

Then, the cap layer 2d is etched as illustrated in FIG. 1C.

Specifically, the cap layer 2d is processed by lithography and dry etching to remove portions of the cap layer 2d other than the portion in which a gate electrode is to be formed. As a result, the cap layer 2d is locally left only in the location where the gate electrode is to be formed.

Figure 2A:
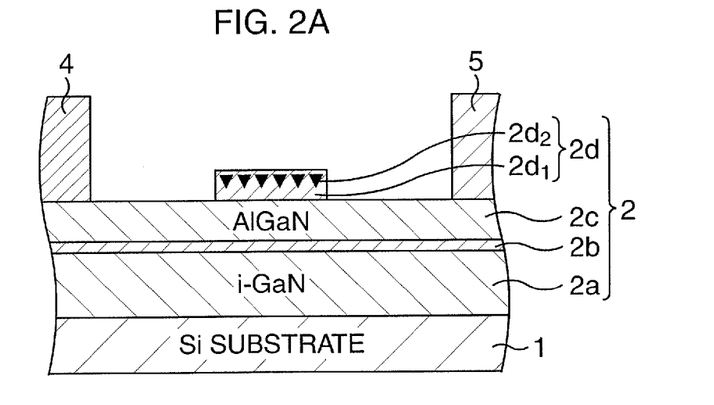
FIG. 2 is a schematic cross-sectional view continued from FIG. 1 illustrating step by step the method for fabricating the AlGaN/GaN HEMT of Schottky type according to the first embodiment.

Then, a source electrode 4 and a drain electrode 5 are formed as illustrated in FIG. 2A.

Specifically, a resist mask for forming the source electrode and the drain electrode is formed first. Here, for example an overhanging double layer resist, which is suitable for vapor deposition and lift-off, is used. The resist is applied on the compound semiconductor multilayer structure 2 and openings that expose a region where the source electrode is to be formed and a region where the drain electrode is to be formed on the surface of the electron donor layer 2c are formed. This completes a resist mask having the openings.

Electrode materials, for example Ta and Al are deposited (Ta is the lower layer and the Al is the upper layer) on the resist mask, including the regions inside the openings, by vapor deposition, for example. Ta is deposited to a thickness of approximately 20 nm; Al is deposited to a thickness of approximately 200 nm. Then the resist mask and Ta/Al deposited on the resist mask are removed by lift-off. Thereafter, the Si substrate 1 is heat-treated at a temperature in the range of 400° C. to 1000° C., for example approximately 550° C., in a nitrogen atmosphere, for example, to bring the remaining Ta and Al into ohmic contact with the electron donor layer 2c. The heat treatment may be omitted if ohmic contact between Ta/Al and the electron donor layer 2c can be made without heating. In this way, the source electrode 4 and the drain electrode 5 are formed on the electron donor layer 2c.

Figure 2B:
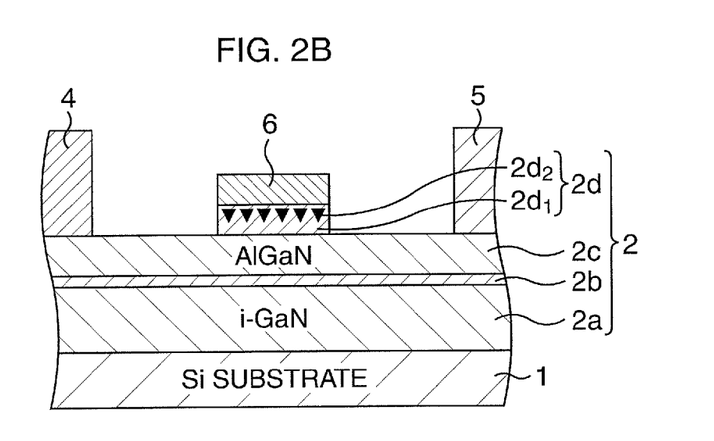

Then, a gate electrode 6 is formed as illustrated in FIG. 2B.

Specifically, a resist mask for forming the gate electrode is formed first. Here, for example an overhanging double layer resist, which is suitable for vapor deposition and lift-off, is used. The resist is applied on the electron donor layer 2c, including the cap layer 2d, and an opening that exposes the cap layer 2d is formed by lithography. In this way, a resist mask including the opening is formed.

Electrode materials, for example Ni and Au, are deposited (Ni is the lower layer and Au is the upper layer) on the resist mask, including the region inside the opening that exposes the cap layer 2d, by vapor deposition, for example. Ni is deposited to a thickness of approximately 30 nm; Au is deposited to a thickness of approximately 400 nm. Then the resist mask and Ni/Au deposited on the resist mask are removed by lift-off. In this way, the gate electrode 6 is formed on the cap layer 2d.

Figure 2C:
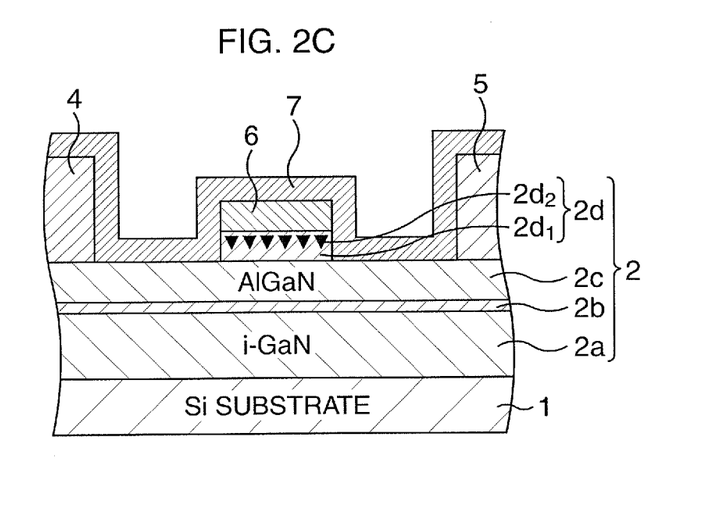

Then, a passivation film 7 which protects the surface of the compound semiconductor multilayer structure 2 is formed as illustrated in FIG. 2C.

Specifically, an insulating film, here a single-layer silicon nitride film (SiN film), is deposited on the compound semiconductor multilayer structure 2 to a thickness of approximately 100 nm, for example, by plasma CVD to cover the source electrode 4, the drain electrode 5, and the gate electrode 6. In this way, the passivation film 7 is formed. The passivation film 7 may be a single-layer silicon oxide film (SiO film), a single-layer silicon oxynitride film (SiON film), or a single-layer aluminum nitride (AlN) film, instead of the single-layer SiN film. A multilayer film including two or more layers formed of materials selected from the group consisting of SiN, SiO, SiON and AlN is also preferable.

Thereafter, the steps such as the steps of forming openings in the passivation film 7 and forming interconnections with the source electrode 4, the drain electrode 5, and the gate electrode 6 are performed to complete an AlGaN/GaN HEMT of Schottky type according to this embodiment.

The effects of the AlGaN/GaN HEMT according to this embodiment will be described in comparison with AlGaN/GaN HEMTs according to comparative examples.

Figure 3A:
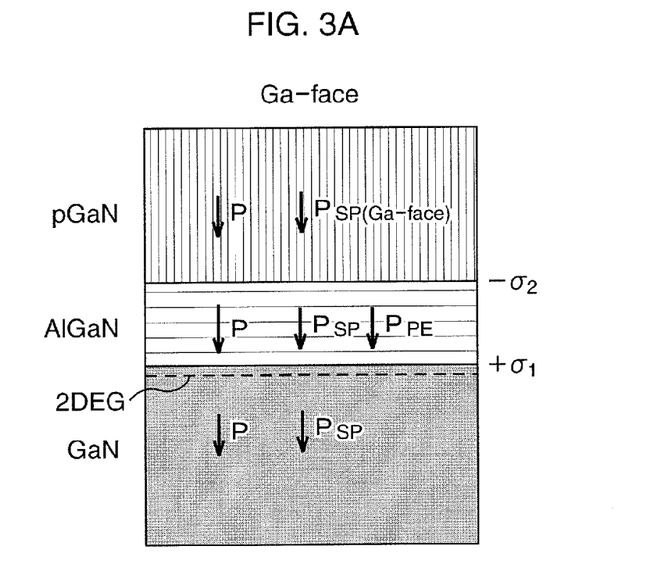
FIG. 3 is a schematic partial cross-sectional view of a compound semiconductor multilayer structure of the AlGaN/GaN HEMT according to a comparative example for comparison with the first embodiment.
Figure 3B:
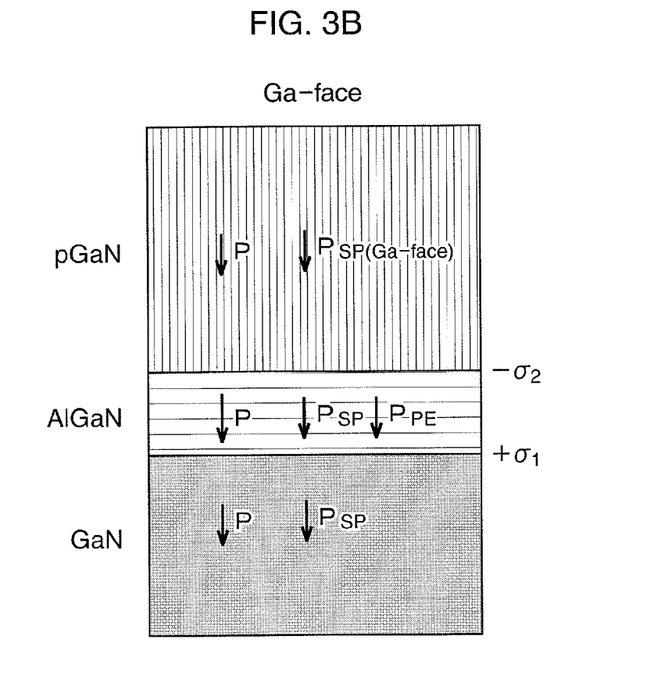
Figure 4:
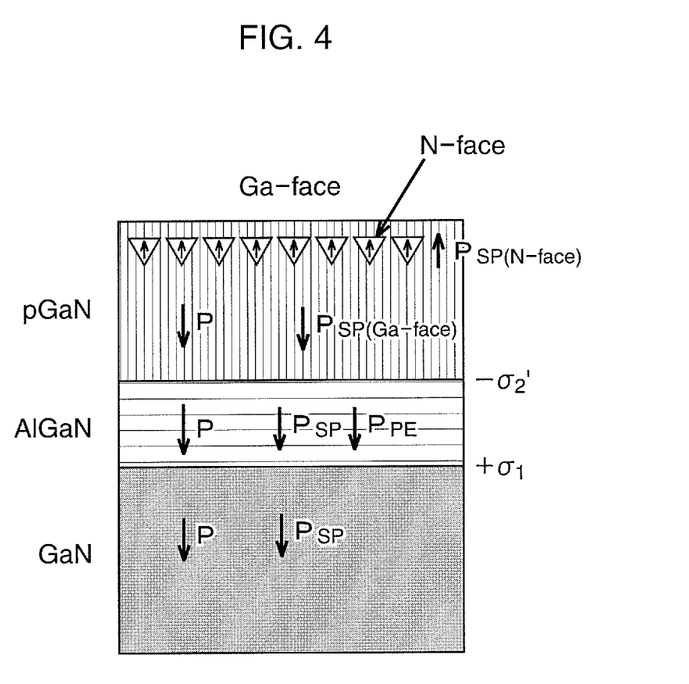
FIG. 4 is a schematic partial cross-sectional view of a compound semiconductor multilayer structure of the AlGaN/GaN HEMT according to the first embodiment.

FIGS. 3A and 3B are schematic partial cross-sectional views of compound semiconductor multilayer structures of the AlGaN/GaN HEMTs of the comparative examples. FIG. 3A illustrates comparative example 1 and FIG. 3B illustrates comparative example 2. FIG. 4 is a schematic partial cross-sectional view of a compound semiconductor multilayer structure of the AlGaN/GaN HEMT according to this embodiment. Intermediate layers are omitted from FIGS. 3A, 3B and the electron transit layer is denoted by GaN, the electron donor layer is denoted by AlGaN, and the cap layer is denoted by p-GaN for convenience of explanation. In the figures, $P_{SP\ (Ga\text{-}face)}$ represents spontaneous polarization in Ga-face, $P_{SP\ (N\text{-}face)}$ represents spontaneous polarization in N-face, and $P_{PE}$ represents piezoelectric polarization.

GaN has a wurtzite crystal structure, which lacks crystal inversion symmetry and therefore has spontaneous polarization. Polarization charge is produced at the GaN/AlGaN/p-GaN hetero interface by the difference between the spontaneous polarization in GaN and the spontaneous polarization in AlGaN. Furthermore, piezoelectric polarization is caused at the GaN/AlGaN hetero interface by the distortion due to the difference in lattice constant between GaN and AlGaN. The piezoelectric polarization in conjunction with the effect of the spontaneous polarization produces high-concentration two-dimensional gas (2DEG) at the GaN/AlGaN interface of the GaN/AlGaN/p-GaN hetero junction.

In comparative examples 1 and 2, the cap layer is made of p-GaN which contains only the same first crystal in the (0001) crystal growth plane as that in the electron transit layer and the electron donor layer as illustrated in FIGS. 3A and 3B. In this case, if p-GaN is relatively thin (for example approximately 50 nm) as in comparative example 1, 2DEG remains under p-GaN to provide a normally-on operation. On the other hand, if p-GaN is relatively thick (for example approximately 100 nm) as in comparative example 2, 2DEG under p-GaN is depleted to provide a normally-off operation. In this case, however, the distance from the gate electrode to the AlGaN/GaN hetero interface, which serves as a channel, is long so that response speed will decrease and electric fields in the channel from the gate electrode will be insufficient, thereby causing defects such as poor pinch-off.

In contrast to comparative examples 1 and 2, this embodiment introduces a polarity-inverted crystal ((000-1) crystal growth plane) having spontaneous polarization in the opposite direction in p-GaN of the cap layer as illustrated in FIG. 4 to reduce spontaneous polarization. Accordingly, the concentration of 2DEG produced at the GaN/AlGaN interface can be eliminated even though p-GaN is thin (for example approximately 50 nm). Since the cap layer exists only under the gate electrode, there is not 2DEG in the channel when gate voltage is off, thus normally-off operation is provided. When gate voltage is on, desired 2DEG is produced in the channel to drive. In this way, high response speed can be ensured and degradations of device characteristics, such as poor pinch-off, can be prevented while p-GaN of the cap layer is formed thin to provide a proper normally-off operation.

As has been described above, this embodiment implements a highly reliable, high-withstand-voltage AlGaN/GaN HEMT of Schottky type that has a thin p-GaN cap layer 2d and yet has high response speed and prevents degradations of the device characteristics, such as poor pinch-off, thereby achieving a stable normally-off operation.

(Variation)

A variation of the first embodiment will be described below. In this variation, an AlGaN/GaN HEMT is fabricated in the same way as in the first embodiment with the difference being the step of fabricating a gate electrode.

FIG. 5 is a schematic cross-sectional view illustrating principal steps of a method for fabricating the AlGaN/GaN HEMT according to the variation of the first embodiment.

In this variation, the steps of FIGS. 1A and 1B are performed first as in the first embodiment.

Figure 5A:
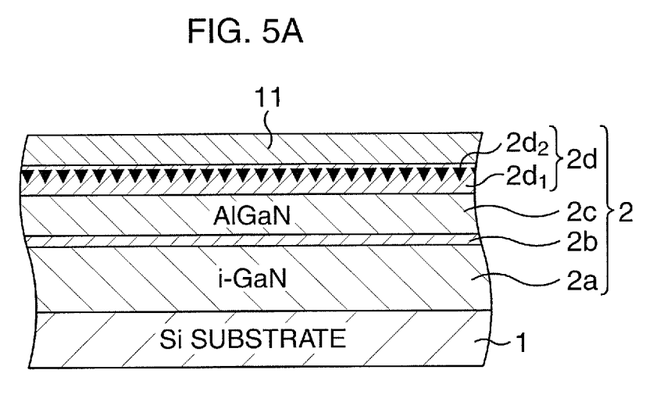
FIG. 5 is a schematic cross-sectional view illustrating principal steps of a method for fabricating an AlGaN/GaN HEMT according to a variation of the first embodiment.

Then, an electrode film 11 is formed on the compound semiconductor multilayer structure 2 as illustrated in FIG. 5A.

Specifically, Ni/Au, for example, is deposited on the cap layer 2d of the compound semiconductor multilayer structure 2 by a method such as vapor deposition. Ni is deposited to a thickness of approximately 30 nm; Au is deposited to a thickness of approximately 400 nm. In this way, the electrode film 11 is formed on the entire surface of the cap layer 2d.

Figure 5B:
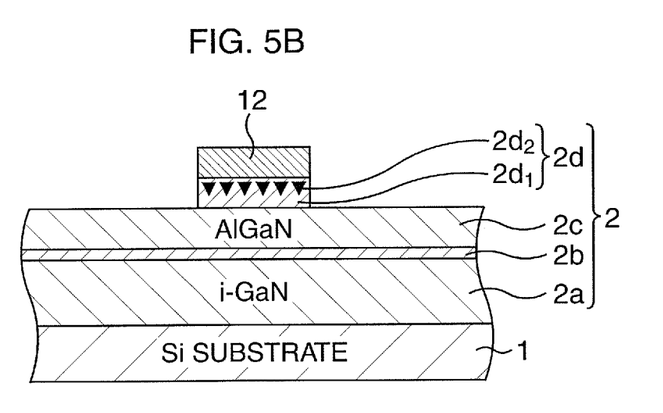

Then, the electrode film 11 and the cap layer 2d are etched at the same time as illustrated in FIG. 5B.

Specifically, the electrode film 11 and the cap layer 2d are processed by lithography and dry etching to remove portions of the electrode film 11 and the cap layer 2d other than the portions where a gate electrode is to be formed. In this way, a gate electrode 12 is formed while the cap layer 2d is self-aligned to the gate electrode 12 and is locally left only under the gate electrode 12.

To achieve a desired normally-off operation, it is desirable that the cap layer 2d be provided only under the gate electrode 12 and self-aligned with the gate electrode 12. In this embodiment, the cap layer 2d is self-aligned with the gate electrode and is shaped in substantially the same shape as the gate electrode 12. Accordingly, a desired normally-off operation can be easily and reliably achieved.

Figure 5C:
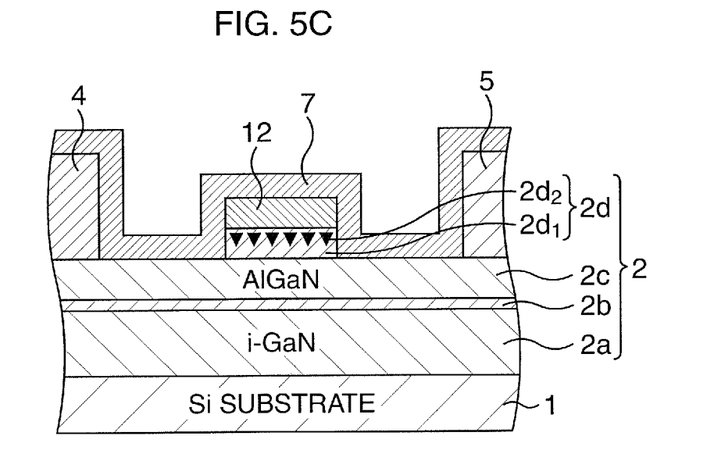

Then, the steps of FIGS. 2A and 2C of the first embodiment are performed in sequence to provide the structure illustrated in FIG. 5C.

Thereafter, steps such as the steps of forming openings in the passivation film 7 and forming interconnections with the source electrode 4, the drain electrode 5, and the gate electrode 6 are performed to complete an AlGaN/GaN HEMT of Schottky type according to this variation.

As has been described above, this variation implements a highly reliable, high-withstand-voltage AlGaN/GaN HEMT of Schottky type that has a thin p-GaN cap layer 2d and yet has high response speed and prevents degradations of the device characteristics, such as poor pinch-off, thereby achieving a stable normally-off operation.

(Second Embodiment)

In a second embodiment, an AlGaN/GaN HEMT of MIS type will be disclosed as a compound semiconductor device.

FIG. 6 is a schematic cross-sectional view illustrating principal steps of a method for fabricating the AlGaN/GaN HEMT of MIS type according to the second embodiment.

In this embodiment, first the steps of FIGS. 1A to 2A are performed in sequence as in the first embodiment.

Figure 6A:
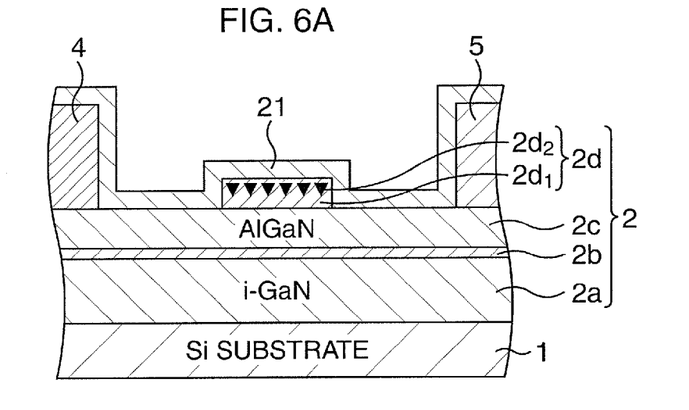
FIG. 6 is a schematic cross-sectional view illustrating principal steps of a method for fabricating an AlGaN/GaN HEMT of MIS type according to a second embodiment.

Then, a gate insulating film 21 is formed as illustrated in FIG. 6A.

Specifically an insulating material, for example $Al_2O_3$, is deposited on the compound semiconductor multilayer structure 2 so as to cover a cap layer 2d. $Al_2O_3$ is deposited by alternately supplying TMA gas and $O_3$ gas using Atomic Layer Deposition (ALD), for example, to a thickness in the range of approximately nm to approximately 200 nm, here for example approximately 10 nm. As a result the gate insulating film 21 is formed.

$Al_2O_3$ may be deposited by other method such as plasma CVD or sputtering, instead of ALD. A nitride or oxynitride of Al may be deposited instead of $Al_2O_3$. Other material such as an oxide or nitride of Si, Hf, Zr, Ti, Ta, or W, or two or more selected as appropriate from these materials may be deposited in layers to form the gate insulating film.

Figure 6B:
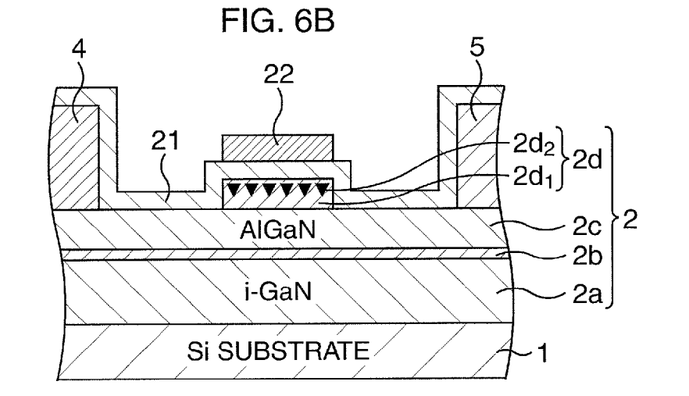

Then, a gate electrode 22 is formed as illustrated in FIG. 6B.

Specifically, a resist mask for forming the gate electrode is formed first. Here, for example an overhanging double resist, which is suitable for vapor deposition and lift-off, is used. The resist is applied on the gate insulating film 21 and an opening that exposes the region in the gate insulating film 21, above the cap layer 2d of the gate insulating film 21, is formed by lithography. In this way, a resist mask having the ponging is formed.

An electrode material, for example Ni/Au is deposited on the resist mask, including the region inside the opening in the gate insulating film 21 above the cap layer 2d, by vapor deposition, for example. Ni is deposited to a thickness of approximately 30 nm; Au is deposited to a thickness of approximately 400 nm. The resist mask and Ni/Au deposited on the resist mask are then removed by lift-off. In this way, the gate electrode 22 is formed in the gate insulating film 21, above the cap layer 2d.

Figure 6C:
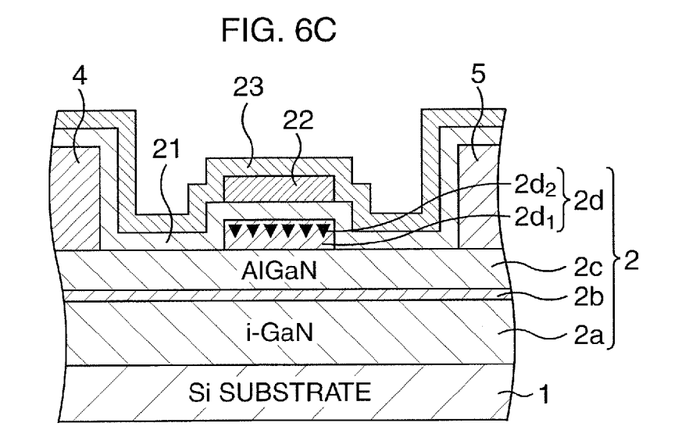

Then, a passivation film 23 is formed as illustrated in FIG. 6C.

Specifically, an insulating film, here a single-layer silicon nitride film (SiN film), is deposited on the gate insulating film 21 to a thickness of approximately 100 nm, for example, by plasma CVD to cover the gate electrode 22. In this way, the passivation film 23 is formed. The passivation film may be a single-layer silicon oxide film (SiO film), a single-layer silicon oxynitride film (SiON film), or a single-layer aluminum nitride (AlN) film, instead of the single-layer SiN film. A multilayer film including two or more layers formed of materials selected from the group consisting of SiN, SiO, SiON and AlN is also preferable.

Thereafter, steps such as the steps of forming openings in the passivation film 23 and the gate insulating film 21 and forming interconnections with the source electrode 4, the drain electrode 5, and the gate electrode 22 are performed to complete an AlGaN/GaN HEMT of MIS type according to this embodiment.

As has been described above, this embodiment implements a highly reliable, high-withstand-voltage AlGaN/GaN HEMT of MIS type that has a thin p-GaN cap layer 2d and yet has high response speed and prevents degradations of the device characteristics, such as poor pinch-off, thereby achieving a stable normally-off operation.

(Third Embodiment)

In a third embodiment, a power supply device to which one type of AlGaN/GaN HEMT selected from the first embodiment and the variation thereof and the second embodiment is applied will be disclosed.

Figure 7:
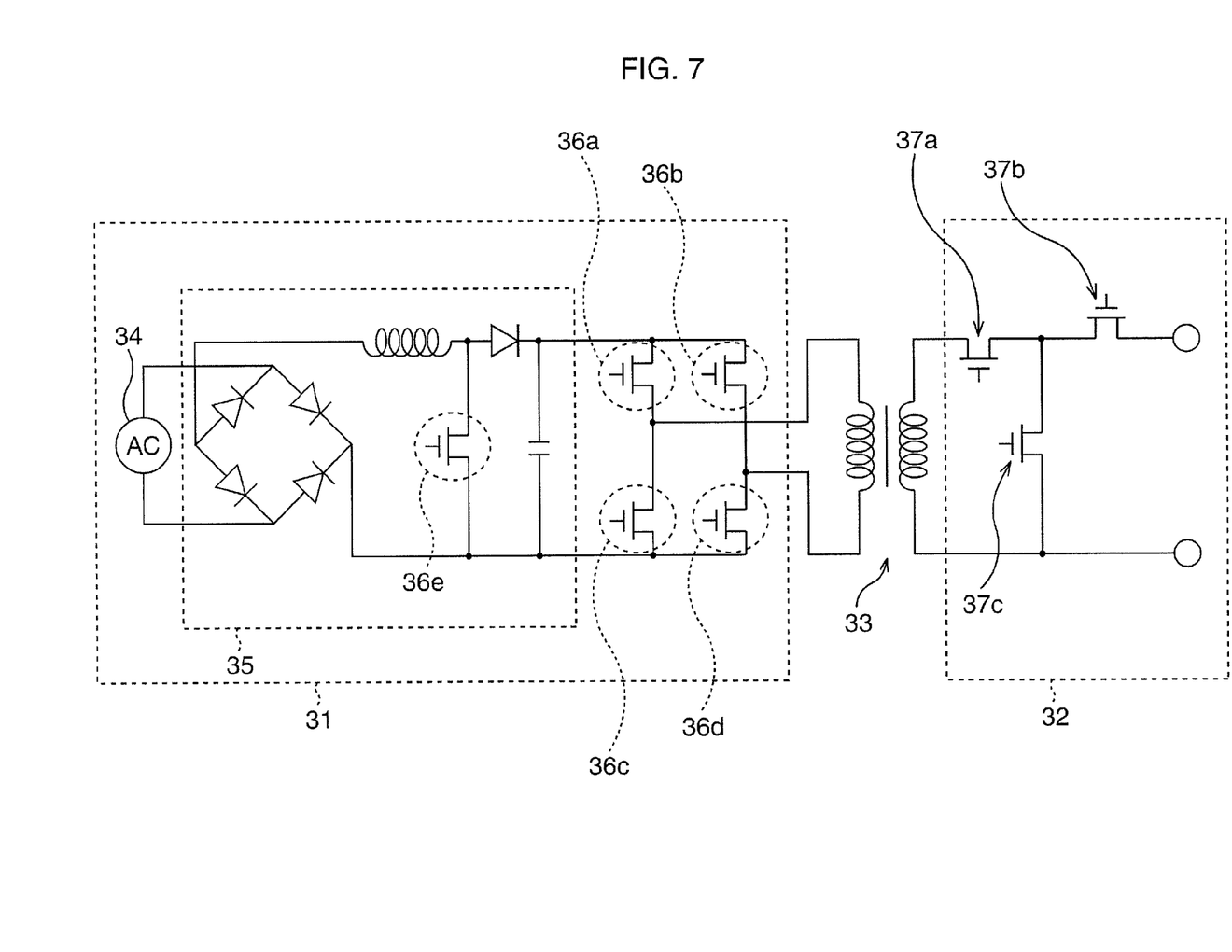
FIG. 7 is a connection diagram schematically illustrating a configuration of a power supply device according to a third embodiment.

FIG. 7 is a connection diagram schematically illustrating a configuration of a power supply device according to the third embodiment.

The power supply device according to this embodiment includes a high-voltage primary circuit 31, a low voltage secondary circuit 32, and a transformer 33 disposed between the primary circuit 31 and the secondary circuit 32.

The primary circuit 31 includes an alternating-current power supply 34, a so-called bridge rectifier circuit 35, and a plurality of (five in this example) switching elements 36a, 36b, 37c, 36d and 36e. The bridge rectifier circuit 35 also includes switching element 36e.

The secondary circuit 32 includes a plurality of (three in this example) switching elements 37a, 37b and 37c.

In this embodiment, the switching elements 36a, 36b, 36c, 36d and 36e of the primary circuit 31 are AlGaN/GaN HEMT of a type selected from the first embodiment and the variation thereof and the second embodiment. The switching elements 37a, 37b and 37c of the secondary circuit 32 are conventional silicon-based MIS FETs.

In this embodiment, a highly reliable, high-withstand-voltage AlGaN/GaN HEMT that has a thin p-GaN cap layer 2d with thin p-GaN and yet has high response speed and prevents degradations of the device characteristics, such as poor pinch-off, to achieve a stable normally-off operation is applied to the high-voltage circuit. Thus, a highly reliable high-power power supply circuit is implemented.

(Fourth Embodiment)

In a fourth embodiment, a high-frequency amplifier device to which one type of AlGaN/GaN HEMT selected from the first embodiment and the variation thereof and the second embodiment is applied will be disclosed.

Figure 8:
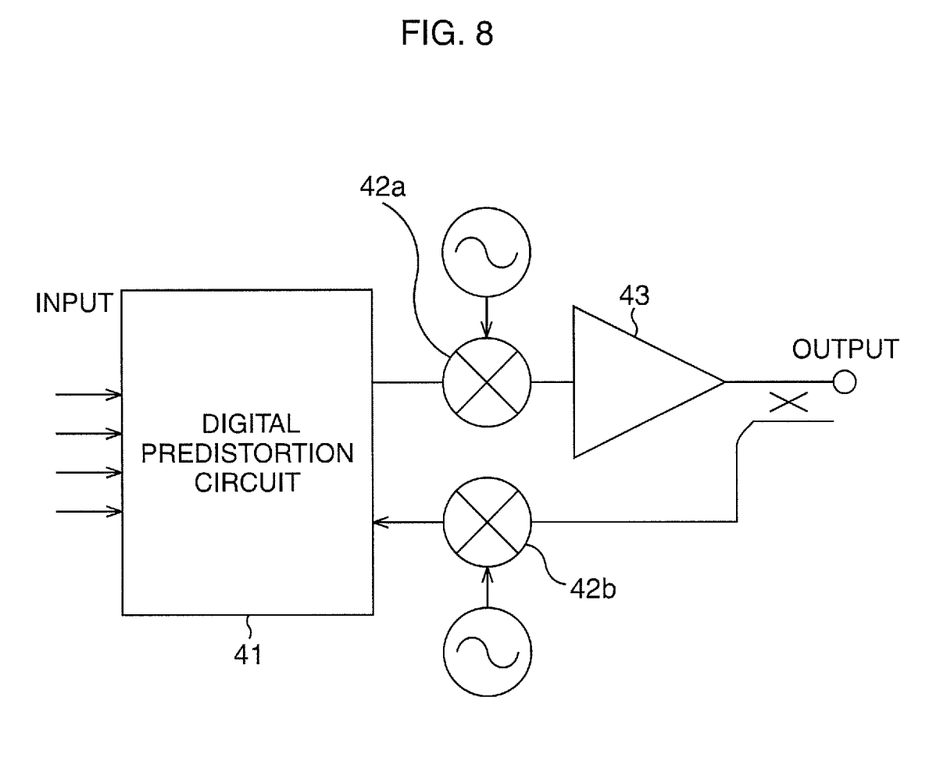
FIG. 8 is a connection diagram schematically illustrating a configuration of a high-frequency amplifier according to a fourth embodiment.

FIG. 8 is a connection diagram schematically illustrating a configuration of a high-frequency amplifier according to the fourth embodiment.

The high-frequency amplifier according to this embodiment includes a digital predistortion circuit 41, mixers 42a and 42b, and a power amplifier 43.

The digital predistortion circuit 41 compensates for non-linear distortion of an input signal. The mixer 42a mixes an input signal whose nonlinear distortion has been compensated for with an AC signal. The power amplifier 43 amplifies an input signal mixed with an AC signal and includes an AlGaN/GaN HEMT of one type selected from among the first embodiment and the variation thereof and second embodiment. It is noted that in FIG. 8, a switching operation of a switch, for example, enables an output signal to be mixed with the AC signal at the mixer 42b and sent back to the digital predistortion circuit 41.

In this embodiment, a highly reliable, high-withstand-voltage AlGaN/GaN HEMT that has a thin p-GaN cap layer 2d and yet has high response speed and prevents degradations of the device characteristics, such as poor pinch-off, to achieve a stable normally-off operation is applied to the high-frequency amplifier. Thus, a highly reliable high-with-stand-voltage power amplifier is implemented.

(Alternative Embodiments)

AlGaN/GaN HEMTs have been illustrated as examples of compound semiconductor device in the first to fourth embodiments. Such compound semiconductor device can be applied to other HEMTs such as those described below as well, in addition to AlGaN/GaN HEMTs.

Alternative Exemplary HEMT 1

In this example, an InAlN/GaN HEMT is disclosed as a compound semiconductor device.

InAlN and GaN are compound semiconductors that have lattice constants that can be made closer to each other by adjusting the composition ratios. In this case, the electron transit layer in the first to fourth embodiments described above is made of i-GaN, the intermediate layer is made of AlN, the electron donor layer is made of n-InAlN, and the cap layer is made of p-GaN. Also in this case, little piezoelectric polarization occurs and therefore two-dimensional electron gas is produced primarily by spontaneous polarization of InAlN.

This example implements a highly reliable, high-withstand-voltage InAlN/GaN HEMT that has a thin cap layer and yet has high response speed and prevents degradations of the device characteristics, such as poor pinch-off, thereby achieving a stable normally-off operation, like the AlGaN/GaN HEMTs described above.

Alternative Exemplary HEMT 2

In this example, an InAlGaN/GaN HEMT is disclosed as a compound semiconductor device.

GaN and InAlGaN are compound semiconductors and the lattice constant of the latter can be made smaller than that of the former by adjusting the composition ratio. In this case, the electron transit layer in the first to fourth embodiments described above is made of i-GaN, the intermediate layer is made of i-InAlGaN, the electron donor layer is made of n-InAlGaN, and the cap layer is made of p-GaN.

This example implements a highly reliable, high-withstand-voltage InAlN/GaN HEMT that has a thin cap layer and yet has high response speed and prevents degradations of the device characteristics, such as poor pinch-off, thereby achieving a stable normally-off operation, like the AlGaN/GaN HEMTs described above.

In an alternative compound semiconductor device, the nitride semiconductor may be AlN and/or InN, or a mixed crystal of any of these and GaN.

The modes described above implement highly-reliable high-withstand-voltage compound semiconductor devices that have a thin cap layer and yet have high response speed and prevent degradations of the device characteristics, such as poor pinch-off, thereby achieving a stable normally-off operation.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
   an electrode transit layer;
   an electron donor layer formed above the electron transit layer; and
   a cap layer formed above the electron donor layer;
   wherein the cap layer contains a first crystal spontaneously polarized in the same direction as the electron transit layer and the electron donor layer and a second crystal spontaneously polarized in the direction opposite to a spontaneous polarization direction of the electron transit layer and the electron donor layer, and
   wherein the cap layer contains a p-type dopant.

2. The compound semiconductor device according to claim 1, wherein each of the electron transit layer and the electron donor layer has a crystal growth plane (0001); and
   the cap layer contains the first crystal comprising a crystal growth plane (0001) and the second crystal comprising a crystal growth plane (000-1).

3. The compound semiconductor device according to claim 1, wherein the cap layer is localized in a predetermined region above the electron donor layer.

4. The compound semiconductor device according to claim 1, further comprising an electrode formed on the cap layer.

5. The compound semiconductor device according to claim 1, wherein the second crystal is formed in the shape of an inverted triangle.

6. A method for fabricating a compound semiconductor device, the method comprising:
   forming an electrode transit layer;
   forming an electron donor layer above the electron transit layer; and
   forming a cap layer above the electron donor layer, the cap layer containing a first crystal spontaneously polarized in the same direction as the electron transit layer and the electron donor layer and a second crystal spontaneously polarized in the direction opposite to a spontaneous polarization direction of the electron transit layer and the electron donor layer,
   wherein the cap layer contains a p-type dopant.

7. The method for fabricating a compound semiconductor device according to claim 6,
wherein each of the electron transit layer and the electron donor layer has a crystal growth plane (0001); and
the cap layer contains the first crystal comprising a crystal growth plane (0001) and the second crystal comprising a crystal growth plane (000-1).

8. The method for fabricating a compound semiconductor device according to claim 6,
wherein the cap layer is formed so that the cap layer is localized in a predetermined region above the electron donor layer.

9. The method for fabricating a compound semiconductor device according to claim 6, the method further comprising forming an electrode on the cap layer.

10. The method for fabricating a compound semiconductor device according to claim 8, the method further comprising:
forming a an electron layer on the cap layer, processing the electrode layer and the cap layer at the same time to localize the cap layer in a predetermined region above the electron donor layer and form an electrode on the cap layer.

11. The method for fabricating a compound semiconductor device according to claim 6, wherein the second crystal is fotuied in the shape of an inverted triangle.

12. A power supply circuit comprising a transformer, and a high-voltage circuit and a low-voltage circuit disposed with the transformer between the high-voltage and low-voltage circuits,
the high-voltage circuit comprising a transistor, the transistor comprising:
an electrode transit layer;
an electron donor layer formed above the electron transit layer; and
a cap layer formed above the electron donor layer;
wherein the cap layer contains a first crystal spontaneously polarized in the same direction as the electron transit layer and the electron donor layer and a second crystal spontaneously polarized in the direction opposite to a spontaneous polarization direction of the electron transit layer and the electron donor layer, and
wherein the cap layer contains a p-type dopant.

\* \* \* \* \*